(12) United States Patent
Hong et al.

(10) Patent No.: US 6,624,041 B2
(45) Date of Patent: *Sep. 23, 2003

(54) METHOD FOR FORMING TRENCH TYPE ISOLATION FILM USING ANNEALING

(75) Inventors: Soo-jin Hong, Seoul (KR); Moon-han Park, Yongin (KR)

(73) Assignee: Samsung Electronics Co., Ltd., Kyungki-do (KR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/316,029

(22) Filed: May 21, 1999

(65) Prior Publication Data
US 2002/0110994 A1 Aug. 15, 2002

(30) Foreign Application Priority Data
May 22, 1998 (KR) .......................... 98-18531

(51) Int. Cl.$^7$ .............................. H01L 21/76
(52) U.S. Cl. ...................... 438/424; 438/435
(58) Field of Search ................ 438/424, 427, 438/435; 257/510

(56) References Cited

U.S. PATENT DOCUMENTS

| | | | |
|---|---|---|---|
| 5,436,488 A | * 7/1995 | Poon et al. | ........ 257/397 |
| 5,966,614 A | * 10/1999 | Park et al. | ........ 438/424 |
| 5,966,616 A | * 10/1999 | Woerlee | ........ 438/424 |
| 6,037,237 A | * 3/2000 | Park et al. | ........ 438/424 |
| 6,087,262 A | * 7/2000 | Yang et al. | ........ 438/692 |

FOREIGN PATENT DOCUMENTS

JP  09205140 B1  8/1997

OTHER PUBLICATIONS

M. H. Park et al., Stress Minimization in Deep Sub–Micron Full CMOS Devices by Using an Optimization of the Trench Filling CVD Oxides. 1997, IEEE, pp. 669–672.*

C. W. Jeon et al., Generation of Trench Dislocation in 0.25mm Logic Technology and Its Elimination. 1999 IEEE, pp. 463–465.*

H. S. Lee et al., An Optimized Densification of Filled Oxide for Quarter Micron shallow Trench Isolation (STI). 1996, IEEE, pp. 158–159.*

Merriam Webster's Collegiate Dictionary, 10 th Edition, 1997.*

Wolf et al. "Silicon Processing for the VLSI Era"vol. 1, Lattice Press, 1986, p. 201.*

* cited by examiner

Primary Examiner—Wael Famy
Assistant Examiner—Anh Duy Mai
(74) Attorney, Agent, or Firm—Lee & Sterba, P.C.

(57) ABSTRACT

A method for forming a trench type isolation film comprises filling a trench with a composite film, flattening the resultant, and annealing the flattened resultant before a gate oxide film is formed. The annealing diffuses out any contaminant existing in an area near and/or contacting the trench on a surface between a semiconductor substrate and a pad oxide film. Therefore, it is possible to prevent the portion of the gate oxide film which is near the trench from becoming thinner than other portions. Accordingly, it is possible to prevent the characteristic of the gate oxide film from deteriorating. In particular, it is possible to prevent a break down voltage from being lowered.

10 Claims, 4 Drawing Sheets

METHOD FOR FORMING TRENCH TYPE ISOLATION FILM USING ANNEALING

BACKGROUND OF THE INVENTION

1. Field of the Invention

The present invention relates to a method for manufacturing a semiconductor device and, more particularly, to a method for forming a trench type isolation film.

2. Description of the Related Art

As semiconductor devices become more highly integrated, the gap between individual semiconductor devices on a semiconductor substrate becomes narrower. Therefore, it becomes very important to electrically insulate the semiconductor devices from each other.

Various types of isolation films are used in the processes involved in manufacturing a semiconductor device. A local oxidation of silicon (LOCOS) type isolation film and a trench type isolation film are representative types.

The LOCOS type isolation film is widely used since it is easily formed, although it occupies a wide area in the semiconductor substrate. This is due, in part, to the formation of bird's beaks which extend into active areas of the semiconductor device. However, as the distance between the semiconductor devices becomes smaller due to the increasing integration of the semiconductor device, the LOCOS type isolation film is replaced by the trench type isolation film which occupies a relatively narrower area on the semiconductor substrate.

Referring to FIG. 1, a trench type isolation film 14 according to a conventional technology is formed by forming a trench 12 in a semiconductor substrate 10, filling the trench 12 with an insulating film 14, and flattening the insulating film 14.

The conventional method for forming the trench type isolation film has the advantage that the geometry of the trench, i.e., the depth and the width of the trench, may be controlled to correspond to the high integration of the semiconductor device. Also, it is possible to increase isolation efficiency by selection of the insulating film used for filling the trench.

However, the process of forming a trench type isolation film is more complicated than for the LOCOS type isolation film because the substrate must be etched to form the trench. Also, the subsequent formation of a gate oxide film often results in contamination due to the insulating film filling the trench. This contamination often occurs at the surface between the semiconductor substrate, particularly that portion near or contacting the trench, and a pad oxide film. If the contamination is present when the gate oxide film is formed, the thickness of the contaminated portion of the gate oxide film 16 becomes thinner than the thickness of other portions, as shown in FIG. 2. As a result, the characteristic of-the gate oxide film deteriorates. For example, the break down voltage of the gate oxide film becomes lower. In addition, the contact leakage current of P+/N or N+/P increases due to the contamination and a shallow pit is formed in the field area.

SUMMARY OF THE INVENTION

It is a desired feature of one embodiment of the present invention to provide a method for forming a trench type isolation film by which it is possible to prevent the characteristic of a subsequent process, in particular, the characteristic of a gate oxide film from deteriorating by contaminants of a previous process.

Toward achieving the above feature, a method for forming the trench type isolation film according to an embodiment of the present invention proceeds as follows:

(a) An active area and a field area are set on the semiconductor substrate. (b) A mask layer, by which the field area is exposed, is formed on the semiconductor substrate. (c) A trench is formed in the field area using the mask layer as an etching mask. (d) An insulating film for filling the trench is formed on the substrate. (e) The substrate on which the insulating film is formed is first annealed. (f) The entire surface of the insulating film is flattened until an underlayer of the insulating film is exposed. (g) The flattened resultant is second annealed.

In the processes, the insulating films which are composite films are first and second oxide films. The first oxide film is an undoped silicate glass (USG) film. The second oxide film is an oxide film (a PE-TEOS film) formed by a plasma enhanced CVD (PECVD) method based on a tetra-ethyl-orthosilicate (TEOS). Also, the second oxide film is an oxide film (a PECVD oxide film based on SiH4) formed by the PECVD method based on silane $SiH_4$ or an oxide film (an HDP film) using high density plasma.

According to another embodiment of the present invention, the first oxide film can be formed of the HDP film. At this time, the second oxide film is formed of a CVD film based on $O_3$-TEOS.

The first oxide film is preferably formed to have a thickness which is the same as the depth of the trench.

The insulating film filled in the trench is flattened by a chemical mechanical polishing (CMP) or an etch back.

The trench is formed after forming a mask layer for exposing the field area on the semiconductor substrate, using the mask layer as an etching mask.

The mask layer is a pad oxide film and a pad nitride film which are sequentially formed.

The second annealing is performed by the following four methods.

First, the second annealing is performed in a state in which the mask layer is formed on the active area.

Second, the second annealing is performed after removing the nitride film of the mask layer.

Third, the second annealing is performed after removing the mask layer.

Fourth, the second annealing is performed after removing the mask layer and ion implanting conductive impurities into a necessary area of the resultant in which the mask layer is removed and before forming a gate oxide film.

The second annealing is preferably performed at a temperature no less than 1,000° C. However, it is more preferable that the second annealing is performed for about an hour under a nitride atmosphere maintained at about 1,050° C.

A method for forming the trench type isolation film, in which the trench is filled with the composite film, the filled material film is flattened, and the resultant is annealed before forming the gate oxide film, is provided.

According to the method for forming the trench type isolation film according to the present invention, it is possible to prevent the characteristic of the gate oxide film from deteriorating due to the contaminants generated during a process of filling the trench with the composite film. For example, it is possible to prevent the thickness of the gate oxide film from becoming thin, the leakage current of the P+/N or N+/P contact surface from increasing, and the shallow pit from being formed.

Briefly, according to another aspect of the present invention, there is provided a method for forming a trench type isolation film in a semiconductor device. The method includes forming a trench in a semiconductor substrate, filling the trench in the semiconductor substrate with an insulating film, annealing the semiconductor substrate and the filled trench, flattening an entire surface of the insulating film, and annealing the flattened resultant.

Briefly, according to another aspect of the present invention, there is provided a method for forming a trench type isolation film in a semiconductor device. The method includes setting an active area, setting a field area, forming a mask layer, forming a trench, filling the trench, first annealing, flattening, and second annealing. The active area and the field area are set in a semiconductor substrate. The mask layer is formed above the semiconductor substrate, and the mask layer is configured such that it does not cover the field area on the semiconductor substrate and such that it does cover the active area on the semiconductor substrate. The trench is formed in the field area of the semiconductor substrate, and the mask layer is used as an etching mask. The trench in the field area of the semiconductor substrate is filled with an insulating film. The semiconductor substrate and the filled trench are first annealed. A top surface of the insulating film is flattened until at least a portion of a layer below the insulating film is exposed. The flattened resultant is second annealed.

BRIEF DESCRIPTION OF THE DRAWINGS

The above features of the invention will become more apparent upon reference to the following detailed description of specific embodiments and the attached drawings, of which.

DESCRIPTION OF SPECIFIC EMBODIMENTS

Figure 1:
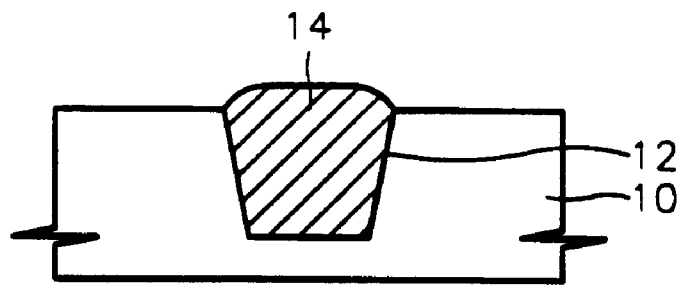
FIG. 1 is a sectional view showing a trench type isolation film formed according to conventional methods.
Figure 2:
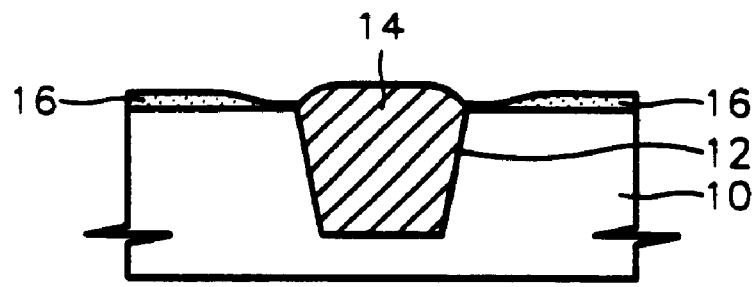
FIG. 2 is a sectional view showing a gate oxide film formed after forming an isolation film according to conventional methods.

Hereinafter, a method for forming a trench type isolation film according to the embodiments of the present invention will be described in detail with reference to the attached drawings.

The present invention is directed toward providing a method for forming a trench type isolation film by which it is possible to prevent the characteristics of a subsequent process, in particular the characteristics of a gate oxide film, from deteriorating as a result of contaminants produced by a previous process. However, the embodiments of the present invention have many variations, and the scope of the present invention is not restricted to the following embodiments. The embodiments of the present invention are provided in order to more completely describe the present invention to anyone of ordinary skill in the art. In the drawings, the thickness of layers and areas are exaggerated for clarity. The same reference numbers denote the same elements. Also, when a certain layer is described to be "on" or "above" another layer or substrate, the certain layer may be formed directly on the other layer or substrate or one or more additional layers may be interposed between the certain layer and the other layer or substrate. An analogous definition is intended for the words "below" and "under".

Figure 3:
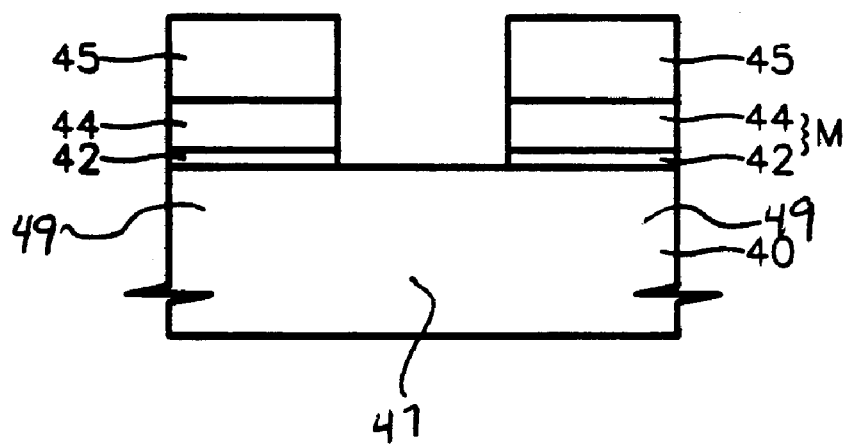
FIGS. 3 through 7 show steps of a method for forming a trench type isolation film according to embodiments of the present invention.

Referring to FIG. 3, a pad oxide film (not shown, but which contains the later-formed pad oxide film pattern 42) and an insulating film (not shown, but which contains the later-formed insulating film pattern 44) are sequentially formed on a semiconductor substrate 40. The pad oxide film is typically a silicon oxide film grown on the entire surface of the semiconductor substrate 40. The insulating film is typically formed of a nitride film $Si_3N_4$. A photosensitive film (not shown), such as a photoresist film, is coated on the entire surface of the insulating film. A photosensitive film pattern 45 covering a defined area of the insulating film is formed by patterning the photosensitive film. A semiconductor substrate area under the photosensitive film pattern 45 is set to be an active area 49. The exposed entire surface of the insulating film, as well as the underlying oxide film, is anisotropically etched using an etching mask until the semiconductor substrate 40 is exposed. As a result, mask layers M, formed of an insulating film pattern 44 and a pad oxide film pattern 42, are formed on the substrate 40. The exposed area of the substrate 40 between the mask layers M is a field area 47.

Figure 4:
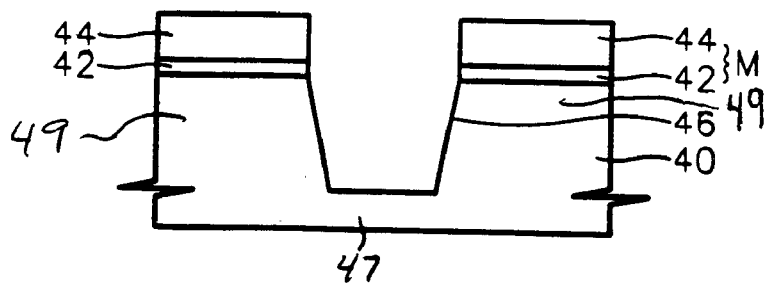

Referring to FIG. 4, a trench 46 having a predetermined depth is formed in an exposed portion of the semiconductor substrate 40 by etching the semiconductor substrate 40 using the mask layers as an etching mask after removing the photosensitive film pattern 45. The geometry of the trench 46, i.e., the depth and the width of the trench 46, can vary according to the degree of integration of the semiconductor device. In the embodiment of the present invention, the trench 46 can be formed to have a depth of about 0.6 $\mu$m.

The trench 46 can be filled with an insulating film. Referring to FIG. 5, in one embodiment of the present invention, a first oxide film 48 for filling the trench 46 is formed on the entire surface of the semiconductor 40. The first oxide film 48 may be formed of an undoped silicate glass (USG) film having a thickness of about 6,000Å. A second oxide film 50 is formed on the first oxide film 48. The second oxide film 50 is preferably formed of a plasma enhanced tetra-ethyl-orthosilicate (PE-TEOS) film. However, it can also be formed of a high density plasma (HDP) film using silane $SiH4$ source gas, or other suitable materials.

A resultant, which contains the first and second oxide films 48 and 50, is first annealed at a high temperature, preferably at least 1,000° C. The density of the first and second oxide films 48 and 50 in the trench 46 is increased by this annealing process. Preferably, the first annealing is performed for about an hour at a temperature of about 1,050° C. in a nitride $N_2$ atmosphere.

In general, the initial stress present immediately after the oxide film is filled in the trench 46 and the thermal stress generated during the first annealing are difficult to measure. However, the operation of a tensile force from the single oxide film can be measured using a single oxide film, such as a CVD film based on $O_3$-TEOS, as a material for filling the trench 46. A tensile force of about $10^{10}$ dyne/cm$^2$ is shown at a temperature of 700° C. in a first annealing process for densifying the oxide film. It is confirmed that the stress is applied to the substrate by such a result. The stress increases during a thermal treatment process from both the initial stress right after deposition and the densification in the case of filling the trench with a single film formed only of the CVD film based on $O_3$-TEOS. The probability of generating a defect in the semiconductor device becomes higher due to the stress.

Accordingly, in one embodiment of the present invention, the trench 46 is filled with a composite film formed of a first oxide film 48 having a tensile force characteristic and a second oxide film 50 having a compressive force characteristic.

Figure 6:
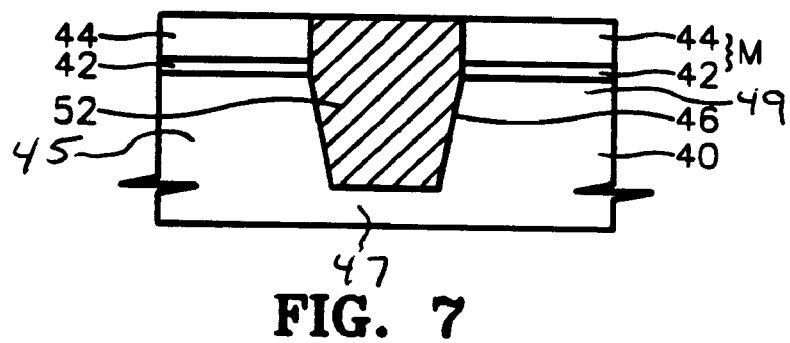

Referring to FIG. 6, the second oxide film 50 is flattened by a chemical mechanical polishing (CMP) method or an etch back method. The insulating film 44 functions as a stopping film during the CMP method or the etch back method. An isolation film 52 for filling the trench 46 is formed by the flattening. The second oxide film 50 is completely removed in the flattening process. Alternate embodiments need not necessarily remove the entire second oxide film 50.

A contaminant such as a hydrogen ion H+ may be generated in the process of densifying the first oxide film 48 and the second oxide film 50. The contaminant exists on a surface between the semiconductor substrate 40, particularly that portion near or contacting the trench 46, and the pad oxide film 42. When a gate oxide film is formed, the thickness of the gate oxide film formed on an area in which the contaminant exists is thinner than the thickness of other portions of the gate oxide film. Therefore, the break down voltage of the gate oxide film becomes smaller.

In order to solve the above problem, the resultant in which the isolation film 52 is formed is second annealed at a predetermined temperature and under a predetermined atmosphere in the present embodiment. For example, the resultant in which the isolation film 52 is formed is second annealed at a temperature no less than 1,000° C., preferably at a temperature of about 1,050° C. in a nitride $N_2$ atmosphere for about an hour. By doing so, the contaminant existing on the surface between the semiconductor substrate 40 and the pad oxide film 42 is out-diffused and removed.

According to alternate embodiments of the present invention, the second annealing of the resultant in which the isolation film 52 is formed can be performed by the following three methods.

First, the second annealing is performed after removing the insulating film 44.

Second, the second annealing is performed after removing the pad oxide film 42.

Third, the second annealing is performed after ion-implanting conductive impurities into the resultant, with the pad oxide film 42 removed, and before a gate oxide film is formed.

Figure 7:
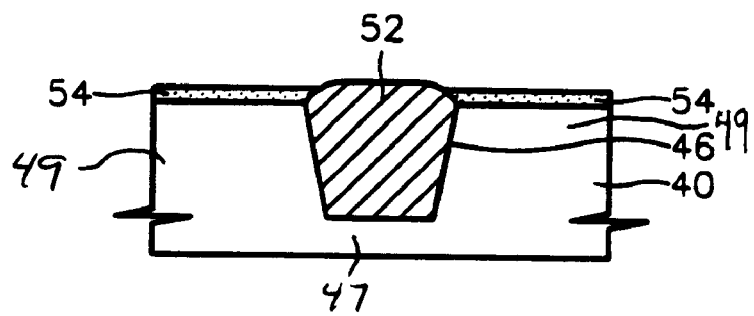

After performing the second annealing, the insulating film 44 is removed with wet chemical, e.g. $H_3PO_4$. Thereafter, the pad oxide film 42 is removed with wet chemical, e.g. HF. In this process, after the surface of the isolation film 52 and the pad oxide film 42 are removed, the surface of the isolation film 52 may come to have the same height as the surface of the semiconductor substrate 40. As shown in FIG. 7, a gate oxide film 54 is formed on the active area 49 of the semiconductor substrate 40. Because the contaminants generated in a previous process are removed by the second annealing, the gate oxide film 54 is formed to have a uniform thickness on the entire surface of the active area 49, as well as near the isolation film 52.

Figure 5A:
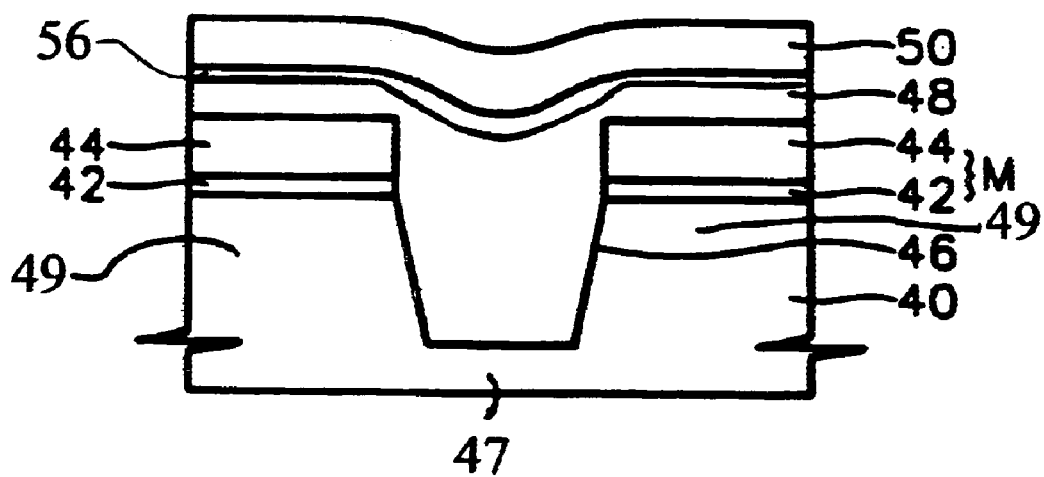
Figure 5:
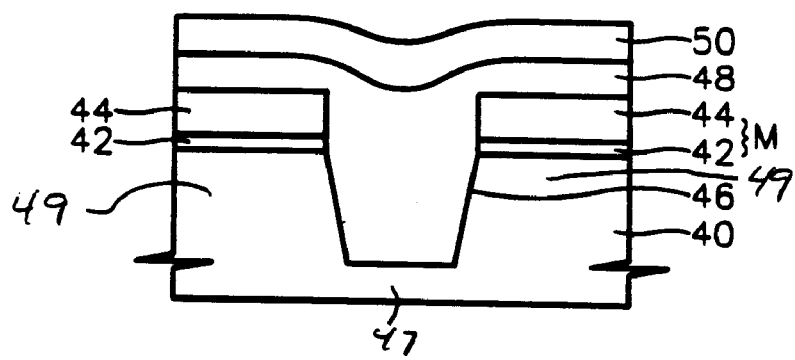

Referring to FIG. 5A, a silicon nitride film SiN 56 may be formed between the first oxide film 48 and the second oxide film 50 as a contaminant shielding film. The silicon nitride film SiN 56 having a thickness of about 100 to 500 angstroms is formed by a CVD method or a rapid thermal nitridation method at a temperature of about 400 to 450 degrees C.

The present invention is not restricted to the above embodiments, and it is clearly understood that many variations are possible within the scope and spirit of the present invention by anyone of ordinary skill in the art.

As mentioned above, the method for forming the trench type isolation film, in which the trench is filled with the composite film, the resultant is annealed and flattened, and the flattened resultant is annealed again before forming the gate oxide film on the active area 49 of the semiconductor substrate, is provided by the present invention. According to the present invention, the contaminant is out-diffused from the area near the trench in the surface between the semiconductor substrate and the pad oxide film. Therefore, it is possible to prevent the portion of the gate oxide film which is near the trench from becoming thinner than other portions in the subsequent process of forming the gate oxide film. Accordingly, it is possible to prevent the characteristic of the gate oxide film from deteriorating and the break down voltage from being lowered. This result is shown by FIGS. 8 and 9.

Figure 8:
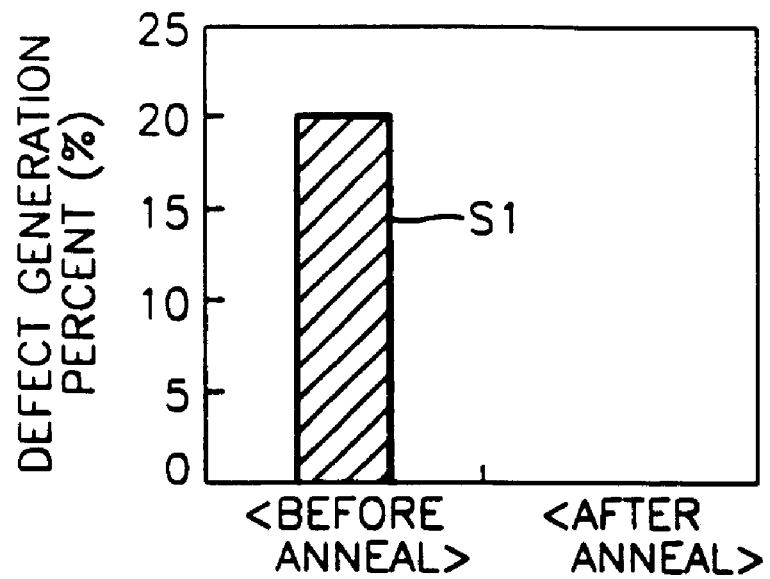
FIG. 8 shows the characteristic of a gate oxide film when the gate oxide film is formed after forming the trench isolation film in PMOS and NMOS areas according to a conventional process and when the gate oxide film is formed after forming the trench isolation film according to an embodiment of the present invention.
Figure 9:
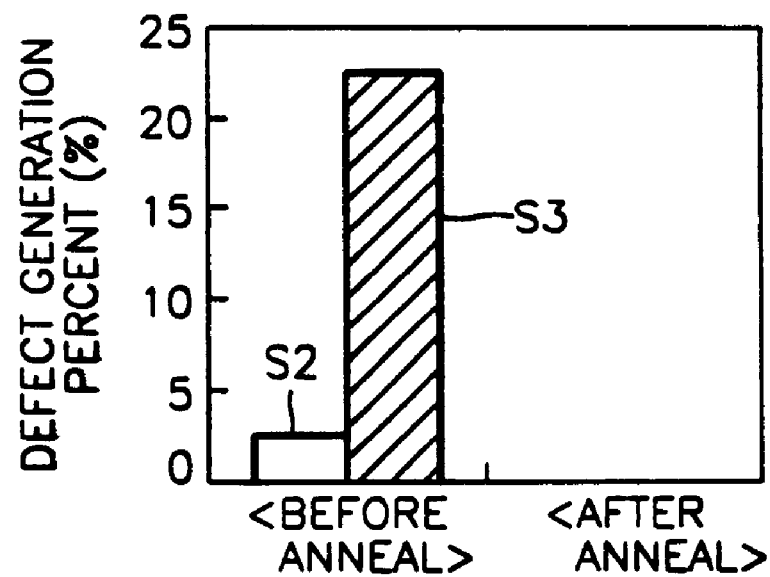
FIG. 9 shows the characteristic of a gate oxide film when the gate oxide film is formed after forming the trench isolation film in an SRAM cell area according to a conventional process and when the gate oxide film is formed after forming the trench isolation film according to an embodiment of the present invention.

FIG. 8 shows the characteristics of the gate oxide film when the gate oxide film is formed after forming the trench isolation film in the PMOS and NMOS areas according to the conventional process (a first case) and when the gate oxide film is formed after forming the trench isolation film according to the embodiments of the present invention (a second case).

In the first case, the trench isolation film is not annealed after chemical mechanical polishing. In the first case, defects are not found in the gate oxide film formed in the NMOS area. When the gate oxide film is formed in the PMOS area, the defect generation ratio of the gate oxide film is about 20% as shown in a first bar S1.

In the second case, after the trench isolation film is chemical mechanical polished, the resultant is annealed. In this case, no defects are found in the gate oxide film in the NMOS and PMOS area as shown in the right side of FIG. 8.

FIG. 9 shows the characteristics of the gate oxide film when the gate oxide film is formed after forming the trench isolation film in the SRAM cell area according to a conventional process (a third case) and when the gate oxide film is formed after forming the trench isolation film according to an embodiment of the present invention (a fourth case).

In the third case, the defects are not shown in the gate oxide film of a load transistor among the transistors which make up the SRAM cell. However, the defects are found in the gate oxide film of a pass transistor and a pull down transistor. The defect generation ratios are respectively about 2.5% and 22.5% as shown in second and third bars (S2 and S3).

In the fourth case, no defects are found in the gate oxide film of any transistor among the transistors which make up the SRAM cell. The right side of FIG. 9 shows the result.

As mentioned above, it is possible to prevent the characteristic of the gate oxide film from deteriorating, due to the contaminants generated during a process of filling a trench with a composite film, in the subsequent process of forming the gate oxide film. According to an embodiment of the present invention, this is achieved by annealing the resultant obtained by chemical mechanical polishing the trench isolation. For example, it is possible to prevent the thickness of the gate oxide film from becoming thin, the leakage current of the P+/N or N+/P contact surface from increasing, and the shallow pit from being formed.

Thus, a method for forming a trench type isolation film using annealing, as well as a semiconductor device including such a film, have been described according to the present invention. While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

Korean Application No. 98 18531, filed May 22, 1998, is hereby incorporated by reference as if fully set forth herein.

What is claimed is:

1. A method for forming a trench type isolation film in a semiconductor device, the method comprising:

setting an active area and a field area in a semiconductor substrate;

forming a mask layer above the semiconductor substrate, wherein the mask layer is configured such that it does not cover the field area and such that it does cover the active area;

forming a trench in the field area of the semiconductor substrate;

filling the trench in the semiconductor substrate with an insulating film;

first annealing the semiconductor substrate and the filled trench;

flattening an entire surface of the insulating film;

second annealing the flattened resultant in an inert atmosphere to out-diffuse contaminants; and removing the mask layer after the second annealing.

2. The method of claim 1, wherein forming a mask layer above the semiconductor substrate comprises forming a pad oxide film and forming a second insulating film above the pad oxide film.

3. The method of claim 1, wherein flattening the entire surface of the insulating film is performed using one selected from the group consisting of chemical mechanical polishing and etching back.

4. The method of claim 1, wherein the second annealing is performed at about 1050 degrees C., for about one hour, in an $N_2$ atmosphere.

5. The method of claim 1, wherein the insulating film is formed of a composite film which comprises a first oxide film and a second oxide film.

6. The method of claim 5, further comprising forming a contaminant shielding film, wherein the contaminant shielding film is formed between the first oxide film and the second oxide film.

7. The method of claim 6, wherein the contaminant shielding film is a SiN film.

8. The method of claim 5, wherein the first oxide film has a tensile force characteristic and the second oxide film has a compressive force characteristic.

9. The method of claim 5, wherein the first oxide film is formed of undoped silicate glass (USG) and the second oxide film is formed of tetra-ethyl-orthosilicate (TEOS).

10. The method of claim 1, wherein the second annealing is performed at a temperature not less than 1000° C.

* * * * *